(12) United States Patent
Stomakhin (10) Patent No.: US 11,062,060 B2
(45) Date of Patent: Jul. 13, 2021

(54) GUIDED SIMULATION WITH GENERALIZED COLLISION OBJECTS

(71) Applicant: Disney Enterprises, Inc., Burbank, CA (US)

(72) Inventor: Alexey Stomakhin, Studio City, CA (US)

(73) Assignee: Disney Enterprises, Inc., Burbank, CA (US)

( * ) Notice: Subject to any disclaimer, the term of this patent is extended or adjusted under 35 U.S.C. 154(b) by 1093 days.

(21) Appl. No.: 15/261,602

(22) Filed: Sep. 9, 2016

(65) Prior Publication Data
US 2018/0075173 A1   Mar. 15, 2018

(51) Int. Cl.
*G06F 30/20* (2020.01)
*G06T 19/00* (2011.01)
*G06T 13/60* (2011.01)

(52) U.S. Cl.
CPC ........... *G06F 30/20* (2020.01); *G06T 19/00* (2013.01); *G06T 13/60* (2013.01); *G06T 2210/24* (2013.01); *G06T 2210/56* (2013.01)

(58) Field of Classification Search
CPC ..... G06F 17/5009; G06F 30/20; G06T 19/00; G06T 13/60; G06T 2210/24; G06T 2210/56
See application file for complete search history.

(56) References Cited

U.S. PATENT DOCUMENTS

| | | | |
|---|---|---|---|
| 2006/0087509 A1* | 4/2006 | Ebert | G06T 13/60 345/473 |
| 2012/0330628 A1* | 12/2012 | McDaniel | G06T 13/20 703/2 |
| 2013/0027407 A1* | 1/2013 | Henderson | G06T 13/60 345/473 |
| 2015/0186565 A1* | 7/2015 | Stomakhin | G06F 17/5009 703/6 |

(Continued)

OTHER PUBLICATIONS

Yuksel, Cem. Real-time water waves with wave particles. Texas A&M University, 2010. (Year: 2010).*

(Continued)

*Primary Examiner* — Chuen-Meei Gan
(74) *Attorney, Agent, or Firm* — Patterson + Sheridan, LLP (57) ABSTRACT

The disclosure provides an approach for simulating three-dimensional (3D) virtual environments using generalized collision objects. In one aspect, the generalized collision object includes a shape specifying the boundary of the generalized collision object, a shape velocity specifying how the generalized collision object moves and evolves through space, and a material velocity specifying how the material being simulated moves at the boundary of the generalized collision object. Taking the shape, shape velocity, and material velocity as inputs, a simulation application determines source and sink boundary conditions to apply in a simulation based on a difference between components of the shape velocity and the material velocity that are normal to the (Continued)

boundary of the generalized collision object. The simulation application then performs the simulation of the 3D virtual environment while enforcing velocity boundary conditions using the material velocity and the determined source and sink boundary conditions.

20 Claims, 7 Drawing Sheets

(56) References Cited

U.S. PATENT DOCUMENTS

2015/0187116 A1* 7/2015 Stomakhin .............. G06T 13/60
　　　　　　　　　　　　　　　　　　　　　　345/419

OTHER PUBLICATIONS

Bhat, Kiran. "Creating Realistic Physical Simulations From Video." (2003). (Year: 2003).*
Dhinesh G, Murali K, Subramanian VA. Estimation of hull-propeller interaction of a self-propelling model hull using a RANSE solver. Ships and Offshore Structures. Aug. 16, 2010;5(2):125-39. (Year: 2010).*
Stomakhin, Alexey, Craig Schroeder, Lawrence Chai, Joseph Teran, and Andrew Selle. "A material point method for snow simulation." ACM Transactions on Graphics (TOG) 32, No. 4 (2013): 1-10. (Year: 2013).*
Hahn, James K. "Realistic animation of rigid bodies." ACM Siggraph computer graphics 22, No. 4 (1988): 299-308. (Year: 1988).*
M. Nielsen and R. Bridson, "Guide Shapes for High Resolution Naturalistic Liquid Simulation," Proc. ACM Siggraph 2011.

* cited by examiner

GUIDED SIMULATION WITH GENERALIZED COLLISION OBJECTS

BACKGROUND

Field of the Invention

Aspects of the disclosure presented herein relate to computer simulation and rendering of three-dimensional (3D) virtual environments. More specifically, this disclosure presents techniques for guided simulation of virtual environments using generalized collision objects.

Description of the Related Art

Physically based simulation has been used to create realistic three-dimensional (3D) virtual environments by leveraging the power of modern computer systems to simulate highly complex visual effects which would otherwise be infeasible to animate "by hand." However, with physically based simulations, an artist is still responsible for providing the initial setup for the simulation to make sure it hits desired visual cues, which typically requires the artist to specify an appropriate set of initial and boundary conditions. It may be difficult for the artist to provide the initial setup that produces the desired visual cues in many cases, such as when the artist wishes to create a breaking wave that needs to have a certain shape at a certain time.

"Guided simulation" refers to a set of techniques that an artist can use to improve such simulations that are difficult to set up, including manually overriding or injecting velocities into the system; applying external force fields; and creating artificial collision objects, sources, and sinks. Creating artificial collision objects, sources, and sinks in particular may give an organic and plausible look to the simulation, as it essentially improves the boundary conditions of the simulation, rather than post-fixing a simulation performed with wrong boundary conditions. However, there is no systematic way of adding collision objects, sources, or sinks, and artists typically use their own intuition to hand-animate collision objects, sources, and sinks used in simulation.

SUMMARY

One aspect of this disclosure provides a computer-implemented method for simulating a three-dimensional (3D) virtual environment. The method generally includes receiving a shape of an object, a shape velocity specifying a motion and a change in shape of the object, and a material velocity specifying a motion of a material at the boundary of the object. The method further includes determining regions of the boundary of the object which act as sources, sinks, and regular collision objects based on differences between normal components of the shape velocity and the material velocity at the regions of the boundary of the object. In addition, the method includes performing a simulation which enforces the sources, sinks, and regular collision objects at the determined regions.

Further aspects include a non-transitory computer-readable storage medium storing instructions that when executed by a computer system cause the computer system to perform the method set forth above, and a computer system programmed to carry out the method set forth above.

BRIEF DESCRIPTION OF THE DRAWINGS

So that the manner in which the above recited aspects are attained and can be understood in detail, a more particular description of aspects of this disclosure, briefly summarized above, may be had by reference to the appended drawings. It is to be noted, however, that the appended drawings illustrate only typical aspects and are therefore not to be considered limiting of its scope, for this disclosure may admit to other equally effective aspects.

To facilitate understanding, identical reference numerals have been used, where possible, to designate identical elements that are common to the figures. It is contemplated that elements and features of one aspect may be beneficially incorporated in other aspects without further recitation.

DETAILED DESCRIPTION

Aspects of the disclosure presented herein provide an approach for simulating three-dimensional (3D) virtual environments using generalized collision objects. In one aspect, a generalized collision object includes a shape, a shape velocity, and a material velocity. The shape specifies the boundary of the generalized collision object. The shape velocity specifies how the generalized collision object moves and, assuming the generalized collision object is deformable, how the shape of the generalized collision object evolves through space. The material velocity specifies how the material (e.g., water, snow, sand) being simulated moves at the boundary of the generalized collision object specified by the shape. Taking the shape, shape velocity, and material velocity as inputs, a simulation application determines boundary conditions applied in a simulation, including source and sink boundary conditions determined based on a difference between components of the shape velocity and the material velocity that are normal to the boundary of the generalized collision object. As used herein, "boundary condition" refers generally to a boundary effect being enforced during simulation. However, it should be understood that, when implemented, a boundary condition may include two steps: first, enforcing a velocity boundary condition using material velocity to resolve velocities in the physical system being simulated (e.g., projection solve for fluid simulation, or force balance stress based solve for solids simulation) and, secondly, performing advection, sinking, and sourcing of the material based on sources, sinks, and impenetrable collision regions (with the sources and sinks also referred to herein as "source boundary conditions" and "sink boundary conditions") of the shape determined by assessing the differences in normal components of the material and shape velocities. From here on forward, impenetrable collision objects/regions will be referred to as "regular collision objects" or "traditional collision objects," as that is what is commonly understood to be "collision objects" in computer graphics and such collision objects should be distinguished from the newly introduced concept of "generalized collision objects."

In one aspect, the simulation application may identify regions in which the normal component of the material velocity is greater than that of the shape velocity as sources from which the material is emitted, regions in which the normal component of the material velocity is less than that of the source velocity as sinks which consume the material, and regions in which the normal component of the material velocity equals that of the shape velocity as impenetrable collision (e.g., slide or stick condition) regions which act as regular collision objects do. The simulation application then performs the simulation of the 3D virtual environment using the determined source, sink, and regular collision regions as well as the original initial and boundary conditions for the simulation.

In the following, reference is made to aspects of this disclosure. However, it should be understood that this disclosure is not limited to specific described aspects. Instead, any combination of the following features and elements, whether related to different aspects or not, is contemplated to implement and practice aspects of this disclosure. Furthermore, although aspects of this disclosure may achieve advantages over other possible solutions and/or over the prior art, whether or not a particular advantage is achieved by a given aspect is not limiting of this disclosure. Thus, the following aspects, features, configurations, and advantages are merely illustrative and are not considered elements or limitations of the appended claims except where explicitly recited in a claim(s).

As will be appreciated by one skilled in the art, aspects of the present disclosure may be embodied as a system, method or computer program product. Accordingly, aspects of the present disclosure may take the form of an entirely hardware configuration, an entirely software configuration (including firmware, resident software, micro-code, etc.) or a configuration combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to aspects of this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Aspects may be provided to end users through a cloud computing infrastructure. Cloud computing generally refers to the provision of scalable computing resources as a service over a network. More formally, cloud computing may be defined as a computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. Thus, cloud computing allows a user to access virtual computing resources (e.g., storage, data, applications, and even complete virtualized computing systems) in "the cloud," without regard for the underlying physical systems (or locations of those systems) used to provide the computing resources.

Typically, cloud computing resources are provided to a user on a pay-per-use basis, where users are charged only for the computing resources actually used (e.g. an amount of storage space consumed by a user or a number of virtualized systems instantiated by the user). A user can access any of the resources that reside in the cloud at any time, and from anywhere across the Internet. In context of the present disclosure, a user may access applications or related data available in the cloud. For example, the application could execute on a computing system in the cloud and simulate 3D virtual environments using generalized collision objects according to aspects of this disclosure. Doing so allows a user to access this information from any computing system attached to a network connected to the cloud (e.g., the Internet).

Figure 1:
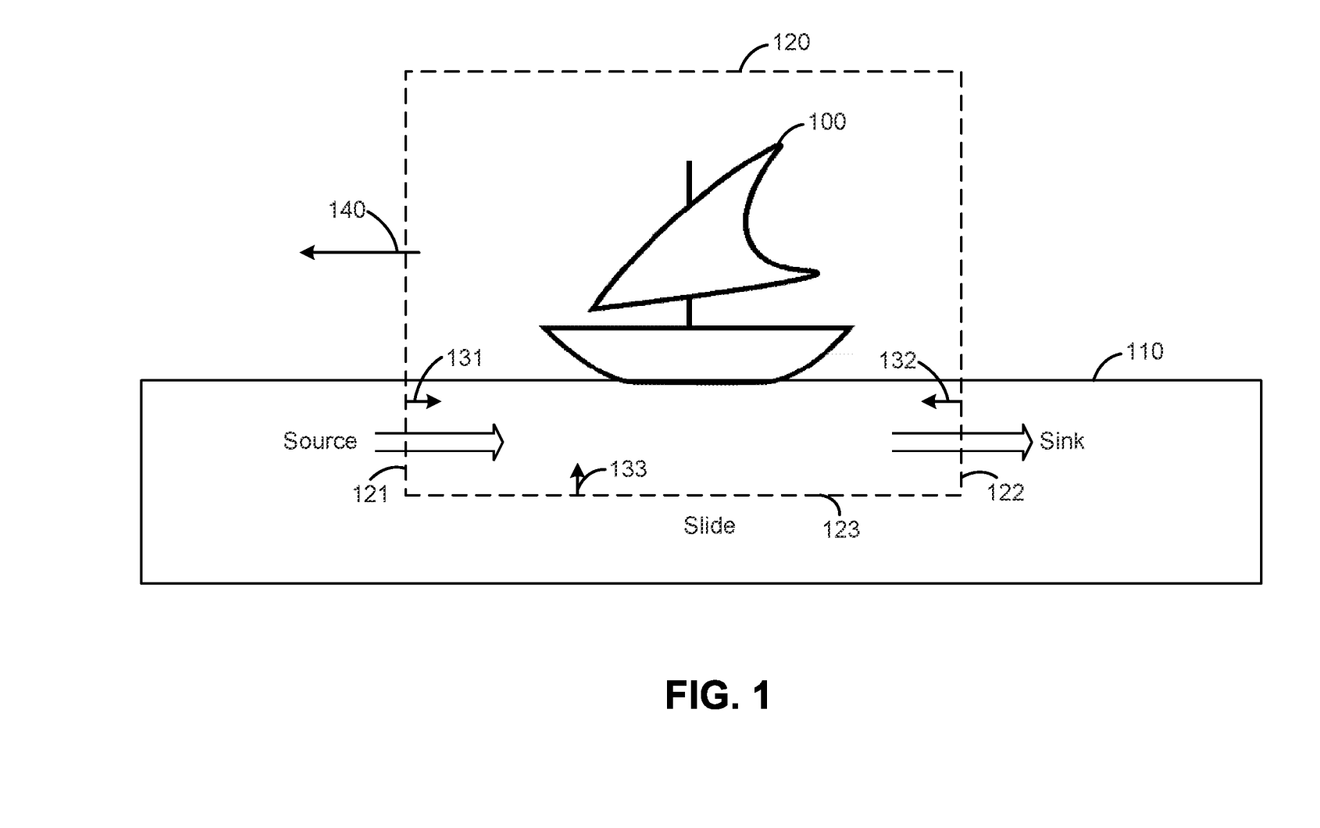
FIG. 1 illustrates an approach for simulating a three-dimensional (3D) virtual environment, according to an aspect of this disclosure.

Referring now to FIG. 1, an approach for simulating a 3D virtual environment according to an aspect of this disclosure is shown. As shown, the simulation is of a boat 100 in a static body of water 110. The static body of water 110 may represent, e.g., an ocean or lake. As it may be computationally intractable to simulate an entire ocean or lake, the simulation application may instead simulate a region 120 around the boat 100, with the water outside the region assumed to be static. Assuming the boat 100 moves, the region 120 being simulated would also have to move. However, simply moving the region 120 with the boat 100 as an impenetrable collision object will not work, as the boat 100 will be moving along with, rather than moving through, the water in the region 120. Such movement of the boat 100 along with the water will not create a wake, which is unrealistic.

In order to create a realistic-looking wake, sink and source boundary conditions need to be specified to indicate how water flows into and out of the region 120 around the boat 100. Traditionally, such boundary conditions have been painted by hand. For example, an artist may manually paint the front 121 of the region 120 as a source, the back 122 of the region 120 as a sink, and the sides (not shown) and bottom 123 of the region 120 as a sliding collision in which there is no friction. In the subsequent simulation, water particles would be emitted from the source in the front 121 and consumed by the sink in the back 122, as if water from outside were flowing through the region 120 from front to back. When such boundary conditions are enforced, the simulation discussed above in which the boat 100 moves along with the region 120 will create a wake, as the boat 100 will be moving through the water that is flowing from the front 121 to the back 122 of the region 120.

Hand-painting boundary conditions is a tedious manual process that requires a physical understanding of what boundary conditions should be applied, which artists may lack. A simulation application according to one aspect disclosed herein automatically determines the correct boundary conditions so that artists do not need to hand paint boundary conditions. In one configuration, the simulation application may take as inputs a shape, a shape velocity, and a material velocity, which together define a generalized collision object. The generalized collision object shown is a collision object that holds the material (water in this case) inside of the simulated area 120 so that, e.g., the material does not fall due to gravity, but other types of generalized collision objects may also be defined. Unlike a traditional collision object that acts as a kinematically defined rigid (or deforming) body with impenetrable boundaries that simply push substances (e.g., water) that come into contact with the collision object aside, the generalized collision object may also enforce source and sink boundary conditions. A source is simply a bounded region of space that creates a simulated substance and pushes it out with a prescribed velocity (or velocity field), while a sink is a bounded region of space that sucks the simulated substance in with a prescribed velocity (or velocity field) when the substance comes into contact with it. Techniques disclosed herein unify sources, sinks, and traditional (or impenetrable) collision objects recognizing that all three are different instances of the same thing, a generalized collision object. Traditional collision objects, sources, and sinks all have a notion of shape or region of space that they occupy, which is the generalized collision object's shape. The shape of the traditional collision objects, sources, and sinks can also potentially be moving, which determines the generalized collision object's shape velocity. The distinction between traditional collision objects, sources, and sinks is in how they react with a simulated substance: traditional collision objects are impenetrable, sources emit material, and sinks suck in material. These behaviors are characterized in the generalized collision object by specifying a corresponding material flow field, the material velocity, such that if the material moves faster than the object shape as projected on the shape normal, the object will emit the material; if the material moves slower than the object as projected on the shape normal, then the object will consume the material; and if the material moves with the same velocity as the object as projected on the shape normal, then the object will appear impenetrable as a traditional collision object with rigid collisions (e.g., sliding or sticky collisions) at the boundary.

The shape of a generalized collision object is effectively its boundary. In the case of the boat 100 moving through the body of water 110, the shape may specify, e.g., the boundary of the region 120 being simulated. Such a shape may remain constant during simulation. However, the shape may generally also evolve through space. For example, the shape in another case may specify the boundary of an animated water character and evolve as the character waves its arms and legs.

The shape velocity describes how the shape of the generalized collision object evolves through space and how the generalized collision object moves. As discussed, the shape of the region 120 may remain constant (i.e., not evolve through space) during simulation of the boat's 100 movement. However, during such a simulation, the region 120 being simulated may move along with the boat's 100 movement. Such movement of the region 120 and the shape bounding it may be specified by a shape velocity (e.g., velocity vector(s) at points in space) representing the movement.

The material velocity describes how the material being simulated moves at the boundary of the generalized collision object specified by the shape. As shown, the body of water 110 is static, meaning the water material does not move and has material velocity 0. It should be understood that this movement of the water specified by the material velocity for purposes of determining boundary conditions is different from water movement generated during simulation of the boat 100 moving through the water 110, which may create a wake as the boat 100 collides with the water 110, i.e., the wake is not the type of water movement specified by the material velocity. Further, if the water 110 is not static (e.g., if there are waves on the water), the material velocity may be non-zero, as discussed in greater detail below.

Given the shape, the shape velocity, and the material velocity, the simulation application determines regions of the generalized collision object that act as sources from which the material is emitted, sinks which consume the material, and impenetrable collision regions where the material may, e.g., slide along the generalized collision object, stick, or bounce off the object. As discussed, this is different from traditional collision objects, which do not enforce source and sink boundary conditions. In one aspect, the simulation application may subtract the normal component of the material velocity from the normal component of the shape velocity. Based on the result of such a subtraction, the simulation application may identify regions in which the normal component of the material velocity is greater than that of the shape velocity (i.e., where the result of the subtraction is positive) as sources, regions in which the normal component of the material velocity is less than that of the shape velocity (i.e., where the result of the subtraction is negative) as sinks, and regions in which the normal component of the material velocity equals that of the shape velocity (i.e., where the result of the subtraction is 0) as impenetrable collision regions.

As shown, vectors 131, 132, and 133 are normal to the front 121, the back 122, and the bottom 133 of the shape of the region 120, respectively. In a simulation of the moving boat 100, the shape velocity 140 is a non-zero velocity pointing forward, in the opposite direction to the normal vector 131 and the same direction as the normal vector 132. In this case, the normal component of the shape velocity at the front 121 is negative and less than the normal component of the material velocity of 0. In contrast, the normal component of the shape velocity at the back 122 is positive and greater than the normal component of the material velocity of 0. The normal component of the shape velocity at the bottom 123 (and on the sides that are not shown) is 0, which is the same as the normal component of the material velocity. Based on the differences between the normal components of the shape velocity and the material velocity in the front 121, the back 122, and the bottom 123 (and the sides), the simulation application may designate the front 121 as a source, the back 122 as a sink, and the bottom 123 (and the sides) as an regular collision regions. In particular, the simulation application may designate the regular collision at the bottom 123 (and the sides) as a sliding collision, although other impenetrable collisions (e.g., sticky collisions) may be used in other cases.

The simulation application then performs the simulation of the 3D virtual environment using the automatically determined boundary conditions and the original boundary conditions (e.g., the boat 100) and initial conditions for the simulation (e.g., initial material location, velocities, and densities). In the particular example of simulating static water, the initial conditions may include, e.g., the positions and velocities of particles of water in the first frame (or a levelset and a velocity field, if the fluid is represented on a grid rather than with particles), while the initial velocities of the static water particles (or the initial velocity field) would be 0 and the density does not need to be specified as it is constant. In each frame (or step) of the simulation, the simulation application enforces boundary conditions by applying corresponding velocity boundary conditions using material velocity during the velocity correction step of the simulation, and by also emitting material from the front 121 of the region 120 and consuming material from the back 122 of the region. After such a simulation, the simulation application may further add displacements representing waves onto the static water 110 as a postprocess to give the appearance that the water 110 is not static.

Figure 2:
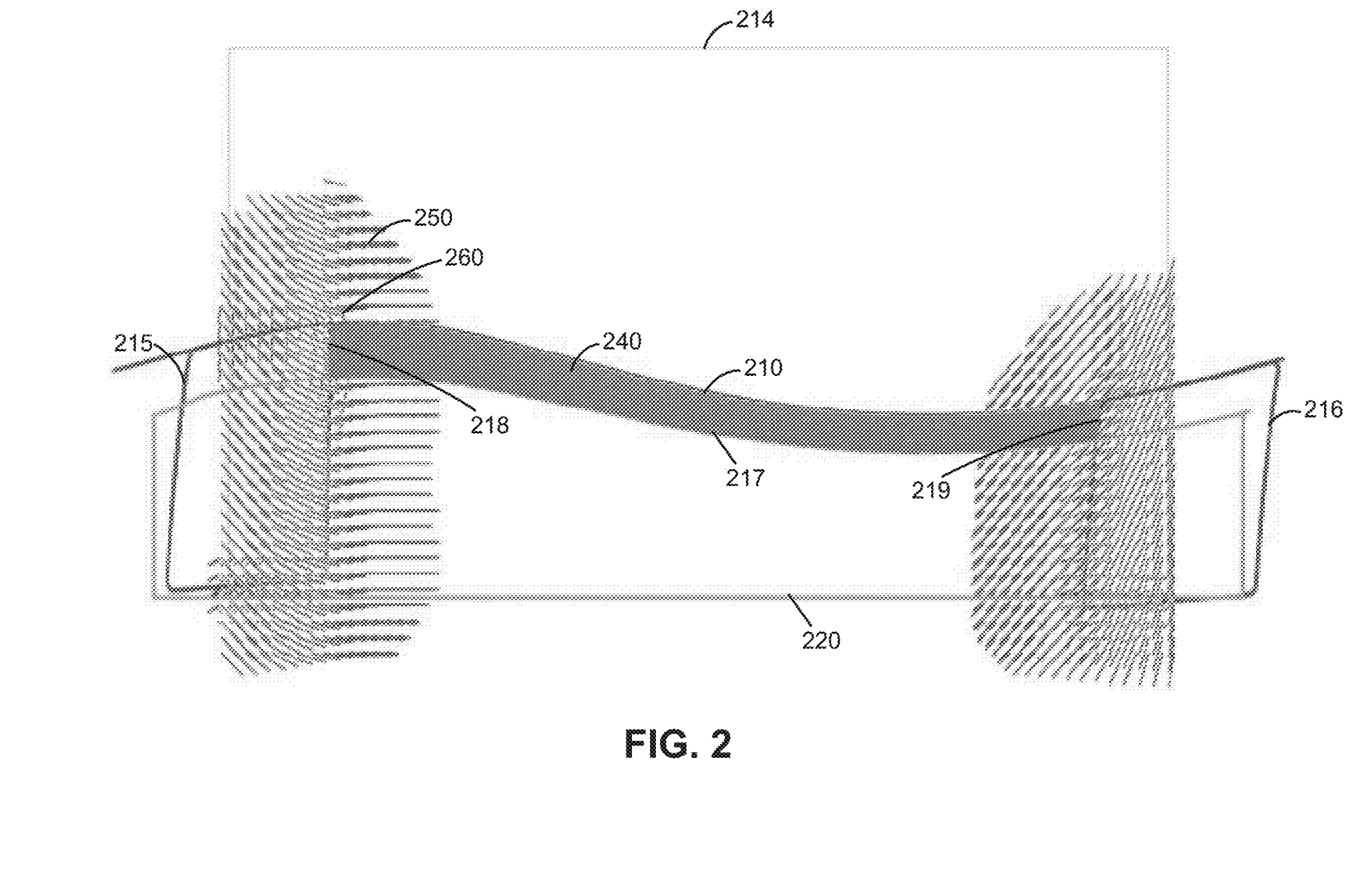
FIG. 2 illustrates an example of using a generalized collision object to simulate the wake of a boat on water with a Stokes wave, according to an aspect of this disclosure.

FIG. 2 illustrates an example of using a generalized collision object to simulate the wake of a boat (not shown) on water with Stokes waves, according to an aspect of this disclosure. The goal is to integrate the simulation of the water in the vicinity of the boat with the outside environment which has Stokes waves. As shown, the shape of the generalized collision object is represented by its front 218, back 219, and sides (not shown) using surfaces of rectangular objects 215 and 216 and similar objects on the sides (not shown), which may themselves be generalized collision objects. The bottom is represented by a traditional collision surface 217. As shown, the collision surface 217 is an eroded-down Stokes wave obtained by eroding a surface 210 of the Stokes wave water, and the collision surface 217 is also the top of a regular collision object 220. The regular collision object 220 may be chosen based on advanced knowledge that only a sliding constraint is needed on the bottom. Other generalized collision objects for ocean or lake-type simulations may also have shapes that resemble a union such as that of the rectangular objects 215 and 216, the regular collision object 220, and the sides (not shown), which together form a sort of "bathtub" that holds the material. During simulation, water particles 240 may only be simulated above the eroded Stokes wave 217 for practical (performance) reasons, although a simulation of particles down to the bottom of simulation bounds 214 would also be valid. For example, the surface 210 of the water, obtained through procedural animation, may be eroded down one meter by translating the surface 210 down in the y coordinate direction, and that meter of water may then be simulated using particles (e.g., the particles 240). Other eroding techniques may also be used, such as eroding wave peaks more than other regions. The erosion used in a particular case may generally depend on artistic choice and performance considerations (e.g., if a boat is 5 meters underwater, the erosion may be chosen to be 5 meters). In one particular configuration shown in FIG. 2, the surface 210 of the water may be eroded more at peaks so that the eroded wave 217 represents a sliding surface according to the Stokes wave formula. This permits a regular collision object to be used at the bottom (surface 217) instead of a generalized collision object, which may save computation time, as it is known in advance that this bottom surface does not represent a sink or a source and there is no need to account for it as such during the simulation. In addition, the simulation as a whole may be bounded by simulation region 214 for efficiency so that, e.g., if water splashes out too far and exits the simulation region 214, then it is removed from the simulation.

A Stokes wave is a physically correct solution to the inviscid Navier-Stokes equation describing the motion of a fluid. As the Stokes wave describes a physical motion of the material (water in this case), it may be fed into a physically based simulation with the appropriate boundary conditions to produce a result that seamlessly integrates with it. That is, the boat and Stokes wave water may be simulated inside the region bounded by the surfaces 217, 218, 219, and the sides (not shown), representing a region of the ocean or lake, and the result may be seamlessly blended with procedurally animated Stokes wave water outside the simulated region that represents the rest (or a larger region) of the ocean or lake, with the generalized collision object acting as an imaginary boundary between the simulation and procedural ocean or lake surfaces. In the simulation, the surfaces of the rectangular objects 215 and 216 and the regular collision object 220 that touch the water represent the bounds of the shape where boundary conditions are imposed. The seamless blending of the simulation and procedural animation is enabled by the uniqueness of the solution to differential equations. That is, if the exact solution to an equation (e.g., the Stokes wave formula) in an area is known, such a solution may be specified as the material velocity boundary condition for a sub-area and used to run the simulation, with the uniqueness of the solution to differential equations guaranteeing that a physically based simulation would recover the same solution to ensure a good (if not perfect) blend between the simulation and the environment around it. Of course, inserting a character or object (e.g. a boat) into the simulation area would change the behavior of the simulation, but for practical purposes the effect is typically negligible if the simulation domain is significantly large and there is enough simulation space around the character or object.

In one aspect, the simulation application may take as inputs the shape which is represented by the surfaces 217, 218, 219, and the sides (not shown), as discussed above. The shape velocity would then be the velocity of such a shape. Here, it will be understood that the eroded Stokes wave 217 at the bottom may move up and down as time evolves. In particular, the shape velocity would include the velocity of the rectangular objects 215 and 216, which may move along with the overall simulation region 214 but may also oscillate and change shape in general, and the shape velocity would also include at the bottom 217 a velocity of the eroded Stokes wave surface 210, which may be obtained by differentiating the velocity potential from the Stokes wave equations:

$$\Phi(x, z, t) = a\frac{\omega}{k}\frac{\cosh k(z+h)}{\sinh kh} \times \left\{\sin\theta \left| ka\frac{3\cosh 2k(z-h)}{8\sinh^3 kh}\sin 2\theta\right.\right\} - (ka)^2 \frac{1}{2\sinh 2kh}\frac{gt}{k} + O((ka)^3).$$

The material velocity, which is also taken as input, may be specified on the sides 218 and 219 and the bottom 217 and obtained by differentiating the velocity potential $\Phi$ at the corresponding boundary locations. The material velocity may generally be decayed exponentially with depth (of the eroded Stokes wave 217), as the motion of waves on the surface tend to be larger than the motion underwater. The material velocity may decay according to $e^{kz}$, which is a ratio representing the exponential decay and is the limit of the $$\frac{\cosh}{\sinh}$$

ratio in the velocity potential $\Phi$. Examples of the material velocity and the shape velocity are shown as vectors 250 and 260, respectively, in FIG. 2.

Similar to the discussion above with respect to FIG. 1, the simulation application determines sink and source boundary conditions on the generalized collision object having the input shape based on a difference (i.e., a subtraction) between the normal components of the shape velocity and the material velocity at the boundary of the generalized collision object. It should be understood that it would be difficult for an artist to hand-paint boundary conditions and produce a physically accurate simulation in the Stokes wave example. The simulation application performs a simulation using automatically determined boundary conditions, original boundary conditions (e.g., boat), and initial conditions for the simulation, with the simulation enforcing the determined boundary conditions at each frame by using material velocity to enforce velocity boundary conditions during the velocity correction step of the simulation, emitting material from regions of the generalized collision object determined to be sources, and consuming material from regions of the generalized collision object determined to be sinks.

Figure 3:
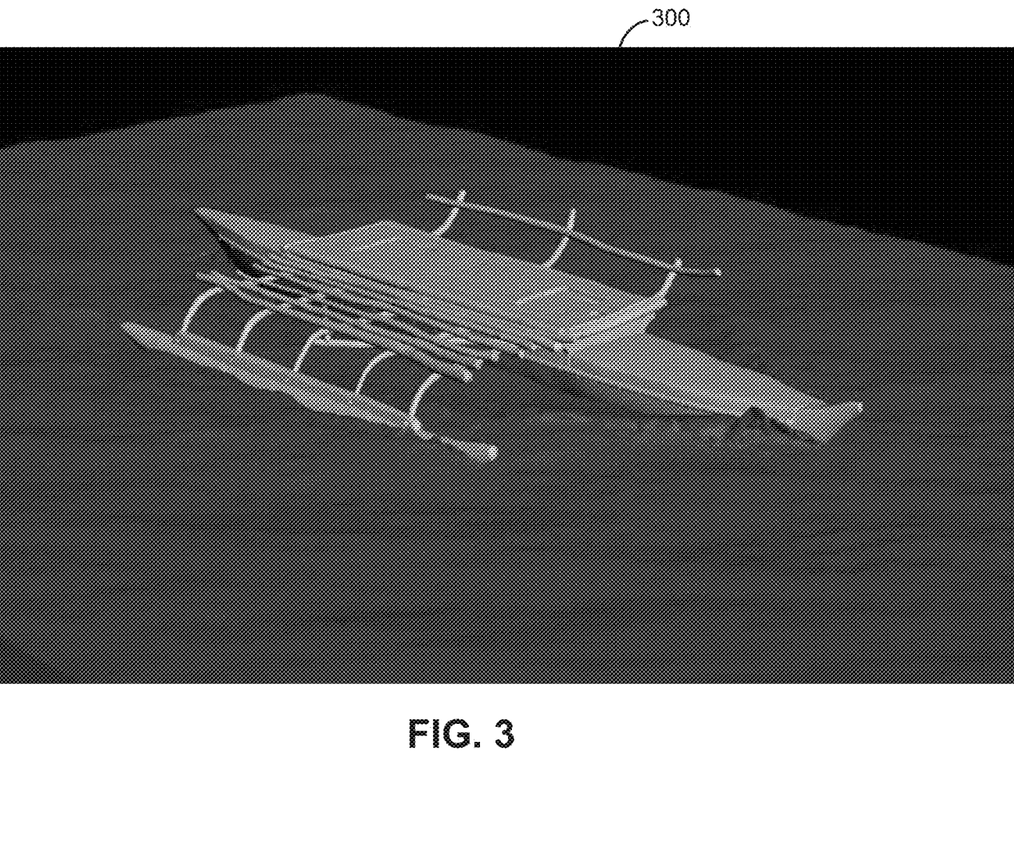
FIG. 3 illustrates an image rendered based on a simulation with multiple Stokes waves, according to an aspect of this disclosure.

In another aspect, the simulation application may simulate multiple Stokes waves, rather than the single Stokes wave discussed above, in a similar manner. For example, the Ocean may be simulated as a sum of Stokes waves, which is typically computed using a Fourier transform for performance reasons. In such a case, the material velocity may be taken as the velocity of the deep ocean spectrum, with the material velocity exponentially decaying with depth as discussed above. In particular, the simulation application may scatter points (not to be confused with particles of the fluid) in the volume of interest, deform the points using a deep ocean spectrum displacement (with the intensity of the spectrum decaying with depth), which may be the same spectrum used to represent the ocean outside the generalized collision object, and use finite differences to compute the velocity from position changes in time. FIG. 3 illustrates an image 300 rendered based on such a simulation with multiple Stokes waves.

Figure 4:
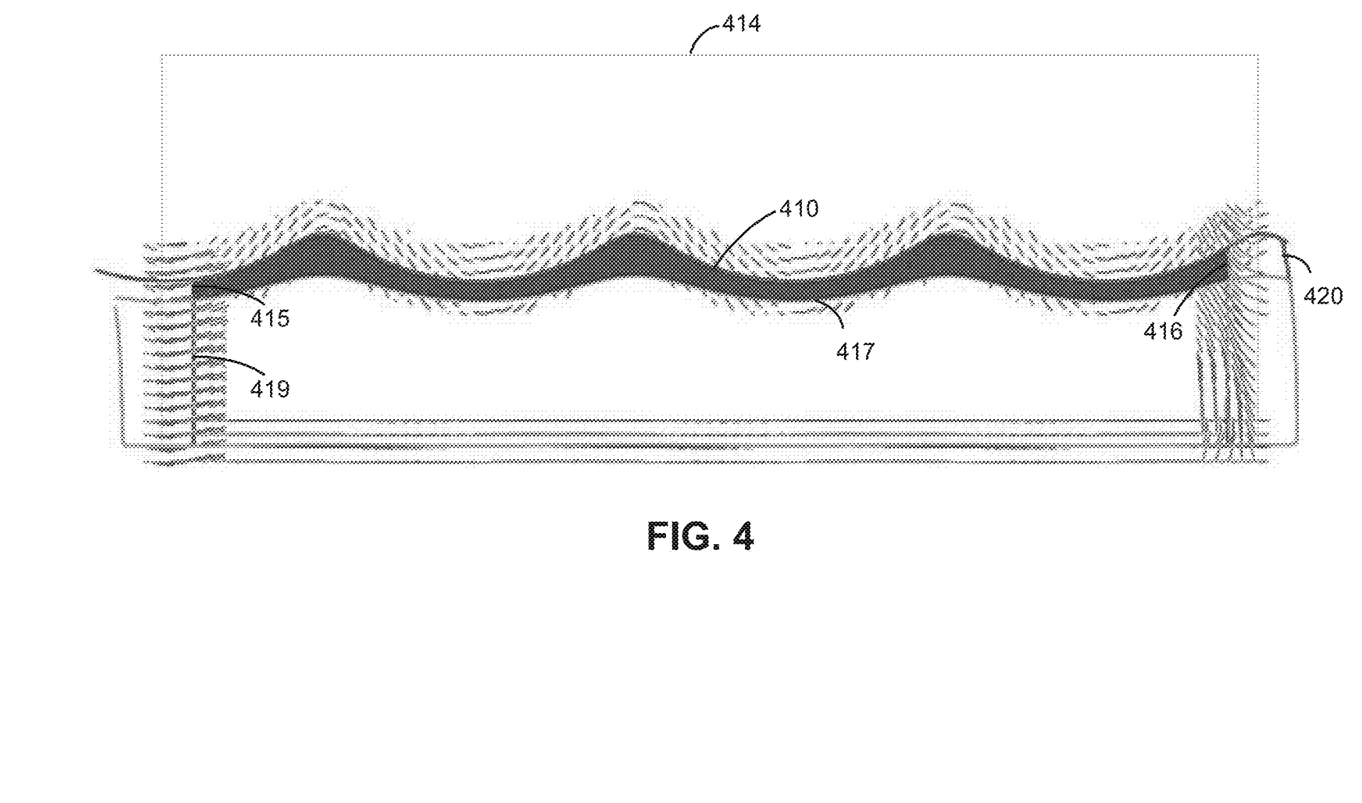
FIG. 4 illustrates an example of using a generalized collision object to simulate the wake of a boat on water with a hand-animated wave, according to an aspect of this disclosure.

FIG. 4 illustrates an example of using a generalized collision object to simulate the wave of a boat (not shown) on water with a hand-animated wave within simulation bounds 414, according to an aspect of this disclosure. The hand-animated wave 410 is similar to the Stokes wave discussed above, except the hand-animated wave's simulated motion is based on an artist's input rather than the Stokes wave equations. Hand-animated waves may not blend well with the rest of the environment outside of bounds 414, as it is difficult for an artist to animate real physics with high precision, but this approach may nonetheless be used sometimes for, e.g., more heavily art-directed (e.g., magical) water characters.

Similar to the discussion above, the shape of the generalized collision object in this hand-animated wave example is represented on its front 415, back 416, and sides (not shown), by e.g., surfaces of rectangular objects 419 and 420, and on the bottom 417 by an eroded version of the hand-animated wave that is the surface 410. The shape velocity would then be the velocity of such a shape as it moves along with the boat, with the shape velocity at the bottom 417 in particular being a velocity of the eroded hand-animated wave surface. In addition, the material velocity for the hand-animated wave may be obtained based on the flow of the material (e.g., the velocity field) provided by an artist directly or from a prior simulation (e.g., a low-resolution simulation), rather than based on differentiating the velocity potential as in the Stokes wave case discussed above.

Given such a shape, shape velocity, and material velocity as inputs, the simulation application enforces velocity boundary conditions using the material velocity and further determines source and sink boundary conditions based on differences between the normal components of the shape velocity and the material velocity at the boundary of the generalized collision object. The simulation application may perform a simulation using such automatically determined boundary conditions and original initial and boundary conditions for the simulation, similar to the discussion above with respect to the Stokes wave case.

Figure 5:
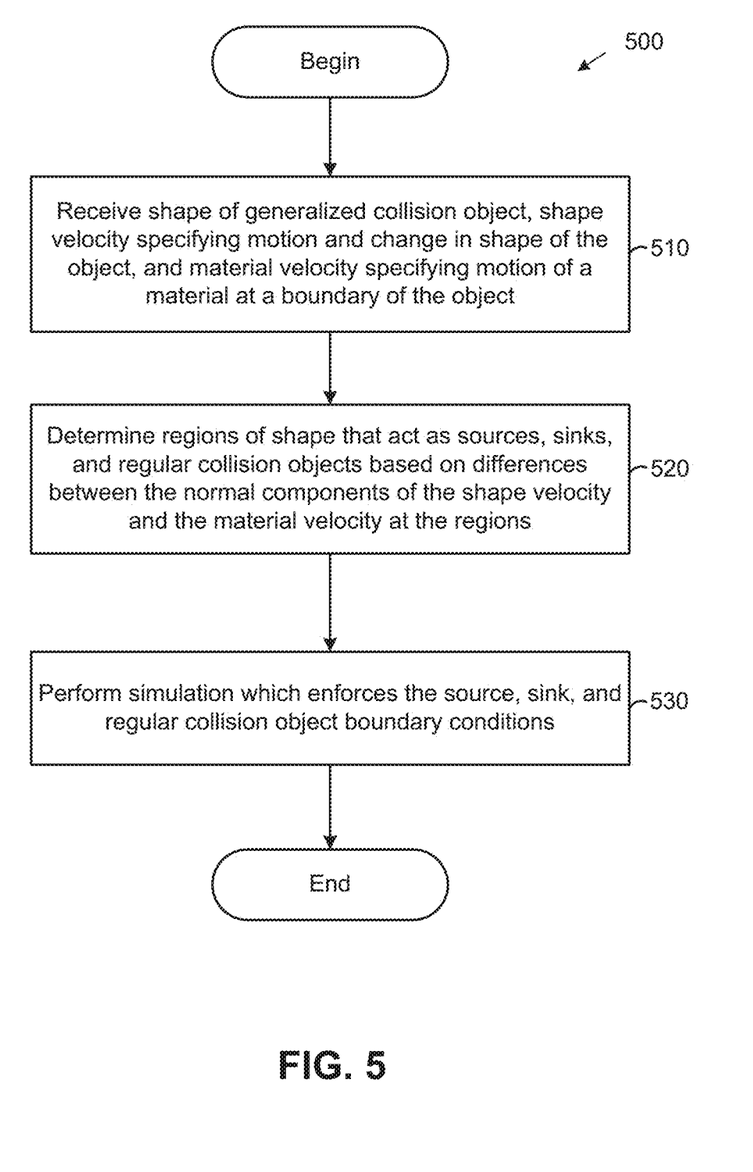
FIG. 5 illustrates a method of simulating a 3D virtual environment, according to an aspect of this disclosure.

FIG. 5 illustrates a method 500 of simulating a 3D virtual environment, according to an aspect of this disclosure. As shown, the method 500 begins at step 510, where a simulation application receives a shape of a generalized collision object, a shape velocity specifying a motion and a change in shape of the object, and a material velocity specifying a motion of a material at a boundary of the object. The shape, shape velocity, and material velocity may be user-defined in one configuration so that artists are able to control the simulation.

At step 520, the simulation application determines regions of the generalized collision object that act as sources, sinks, and regular collision objects based on differences between the normal components of the shape velocity and the material velocity at the regions of the boundary. As discussed, the simulation application may subtract the normal component of the material velocity from the normal component of the shape velocity on the shape of the generalized collision object. The simulation application may then identify regions of the generalized collision object in which the normal component of the material velocity is greater than that of the shape velocity as sources that emit material. Further, the simulation application may identify regions of the generalized collision object in which the normal component of the material velocity is less than that of the shape velocity as sinks that consume material, and regions in which the normal component of the material velocity equals that of the shape velocity as impenetrable collision regions.

At step 530, the simulation application performs a simulation which enforces the determined sources, sinks, and regular collision object boundary conditions. As discussed, a simulation generally takes original initial conditions and boundary conditions as input, and the simulation application may additionally enforce the sources, sinks, and regular collision object boundary conditions from the generalized collision objects. The simulation may generally be any Eulerian simulation or hybrid Eulerian-Lagrangian simulation, such as a material point method (MPM) simulation. The simulation may further be rendered as an image, such as the image 300 discussed above with respect to FIG. 3, or multiple images (e.g., frames of a movie), according to known techniques, and then displayed on a display device.

Figure 6:
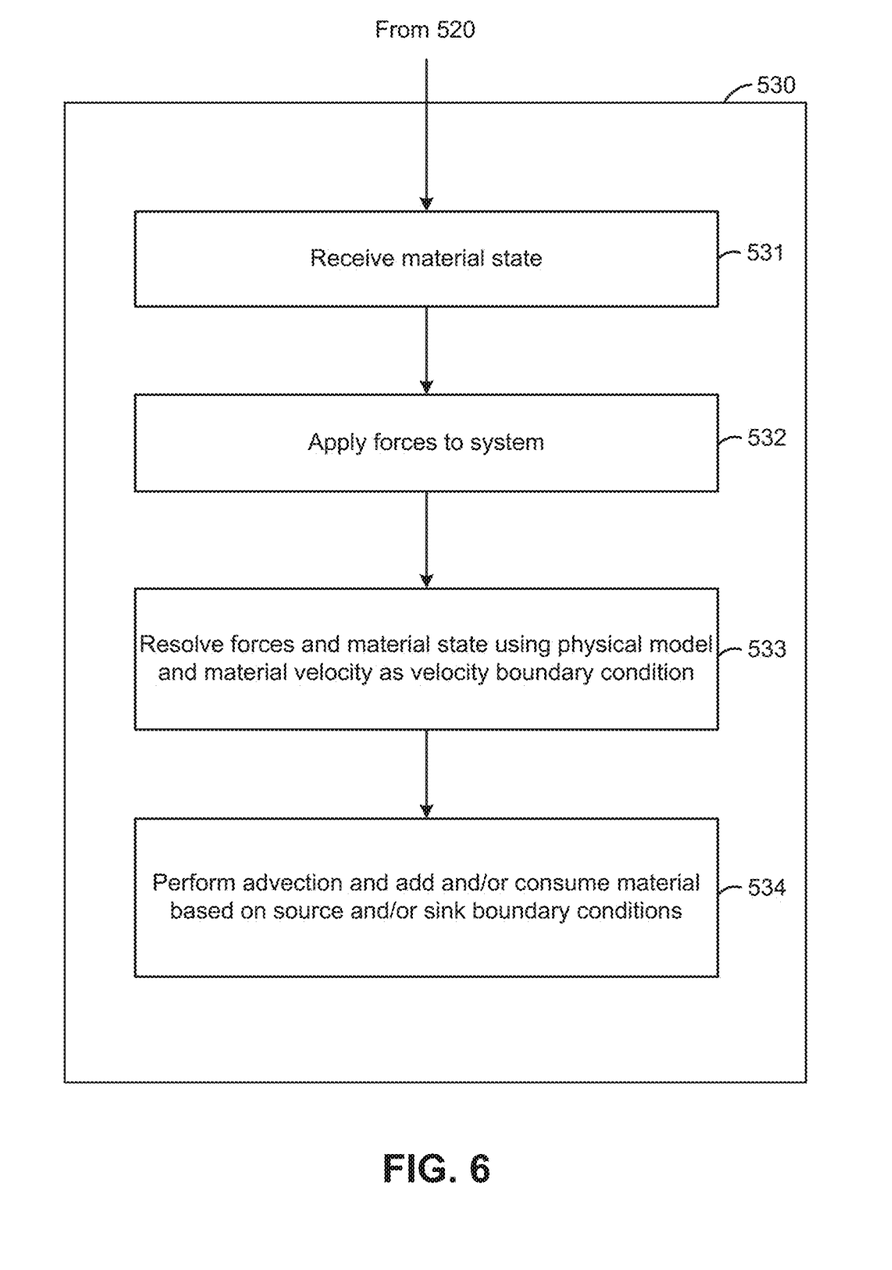
FIG. 6 illustrates in greater detail one of the steps of the method of FIG. 5, according to an aspect of this disclosure.

FIG. 6 illustrates in greater detail steps for performing the simulation in step 530 of method 500, according to an aspect of this disclosure. One step (e.g., for one frame) of a simulation is shown as a reference example, although it should be understood that the shown steps 531-534 may generally be repeated multiple times for multiple frames. As shown, at step 531, the simulation application receives the material state. The material state may include Lagrangian positions, velocities, masses, etc. and/or Eulerian grid velocities, densities etc., depending whether the simulation is an Eulerian, Lagriangian, or a hybrid Eulerian-Lagrangian simulation, as will be understood by persons skilled in the art. The material state may be inferred from initial conditions or obtained from a previous step performed for another frame.

At step 532, the simulation application applies forces to the system. For example, the simulation may apply gravity, forces (e.g., friction) imposed by characters or objects (e.g., the boat 100), and the like which affect the material.

At step 533, the simulation application resolves forces and material state using a physical model and the material velocity as a velocity boundary condition. Velocities in the system being simulated may be resolved using the material velocity with, e.g., a projection solve for a fluid simulation, or a force balance stress based solve for a solids simulation. The resolving of the material state may also include transferring Lagrangian data to Eulerian representation and back in a hybrid Eulerian-Lagrangian simulation. As an example, pushing on one end of a fluid may create a shock wave that propagates through the entire system. Resolving such propagation would require enforcement of velocity boundary conditions. To enforce such velocity boundary conditions, the simulation application may query the material velocity to impose at the appropriate locations, and then perform the projection solve with those boundary conditions for fluid simulations discussed above. It should be understood that this step does not require knowing which parts of the boundary are sinks, sources or regular collisions, as it is uniformly handled by the material velocity.

Then at step 534, which is the end of the simulation step, the simulation application performs advection and adds and/or consumes material based on source and/or sink boundary conditions. This step does require knowledge of which regions of the boundary act as sinks, sources, or regular collisions to properly consume or add material based on such conditions. As discussed, in one configuration, the sources, sinks, and regular rigid collision regions may be determined based on differences in the normal components of the material and shape velocities, with regions where the normal component of the material velocity is greater than that of the shape velocity being sources, regions in which the normal component of the material velocity is less than that of the shape velocity being sinks, and regions in which the normal component of the material velocity equals that of the shape velocity being regular rigid collision regions.

Figure 7:
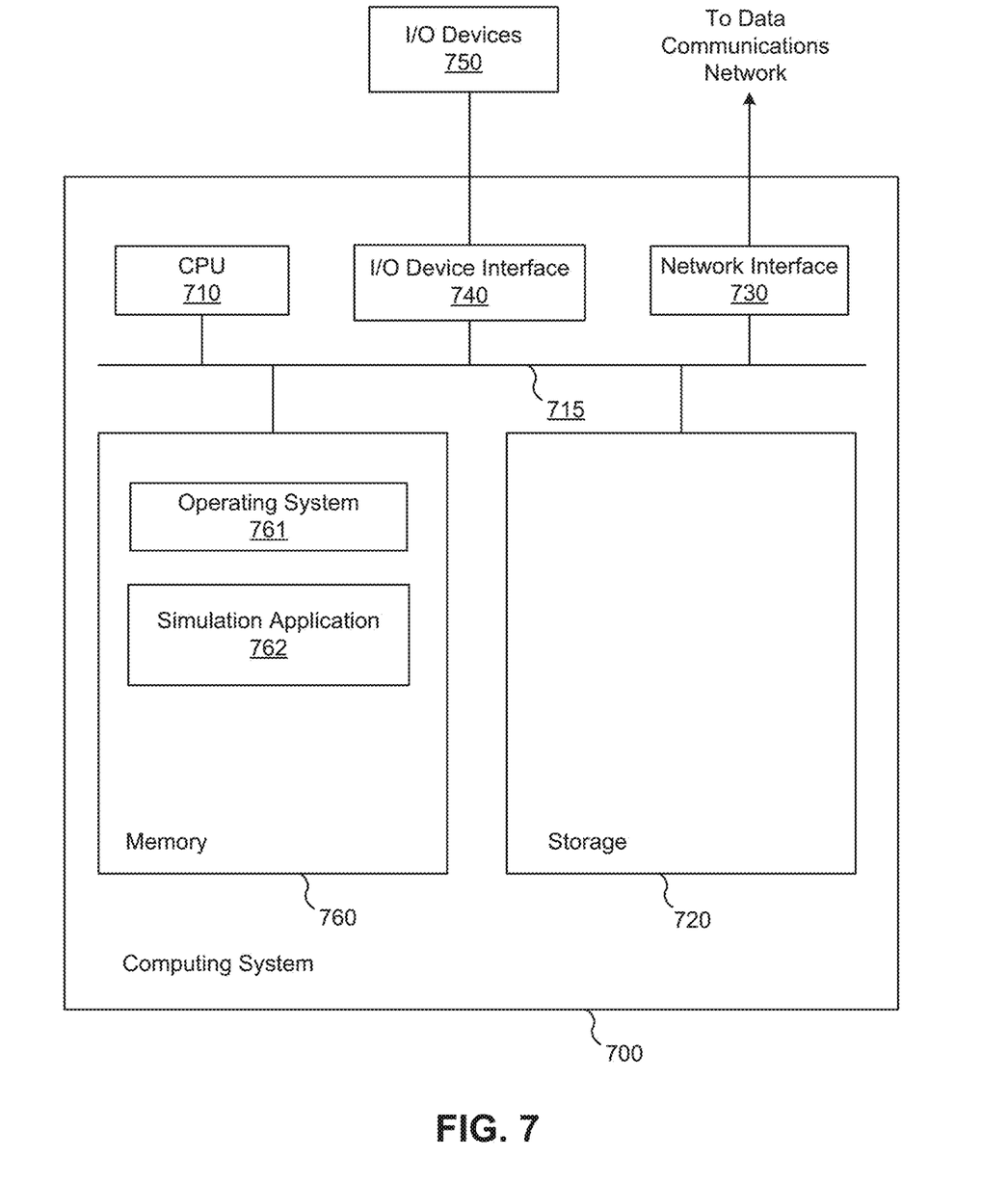
FIG. 7 illustrates a computer system in which an aspect of this disclosure may be implemented.

FIG. 7 illustrates a computer system 700 in which an aspect of this disclosure may be implemented. As shown, the system 700 includes, without limitation, a central processing unit (CPU) 710, a network interface 730, an interconnect 715, a memory 760 and storage 720. The system 700 may also include an I/O device interface 740 connecting I/O devices 750 (e.g., keyboard, display and mouse devices) to the system 700.

The CPU 710 retrieves and executes programming instructions stored in the memory 760. Similarly, the CPU 710 stores and retrieves application data residing in the memory 760. The interconnect 715 facilitates transmission, such as of programming instructions and application data, between the CPU 710, I/O device interface 740, storage 720, network interface 730, and memory 760. CPU 710 is representative of one or more of a single CPU, multiple CPUs, a single CPU having multiple processing cores, one or more graphics processing units (GPUs), and the like. And the memory 760 is generally included to be representative of a random access memory. The storage 720 may be a disk drive storage device. Although shown as a single unit, the storage 720 may be a combination of fixed or removable storage devices, such as fixed disc drives, floppy disc drives, removable memory cards or optical storage, network attached storage (NAS), or a storage area-network (SAN). Further, system 700 is included to be representative of a physical computing system as well as virtual machine instances hosted on a set of underlying physical computing systems. Further still, although shown as a single computing system, one of ordinary skill in the art will recognized that the components of the system 700 shown in FIG. 7 may be distributed across multiple computing systems connected by a data communications network.

As shown, the memory 760 includes an operating system 761 and a simulation application 762. Illustratively, the operating system 761 may include Linux® or Microsoft Windows®. The simulation application 762 is configured to simulate a 3D virtual environment using generalized collision object(s). In one configuration, the simulation application 762 may receive a shape of an object, a shape velocity specifying a motion and a change in shape of the object, and a material velocity specifying a motion of a material at a boundary of the object; determine differences between normal components of the shape velocity and the material velocity at the boundary of the generalized collision object; determine regions of the generalized collision object that act as sources, sinks, and regular collision objects based on the differences between the normal components of the shape velocity and the material velocity at the regions of the boundary; and perform a simulation with the determined sources, sinks, and regular collision object regions as boundary conditions, according to the method 500 discussed above with respect to FIGS. 5-6. In addition, the results of the simulation may be rendered as one or more images for display on a display device.

Although discussed above primarily with respect to water, techniques disclosed herein are also applicable to any other material that is able to flow, such as snow, sand, dirt, lava, and the like. Although discussed above primarily with respect to a body of water such as an ocean or lake, it should be understood that techniques disclosed herein are applicable to other types of simulations. For example, a simulation of a sink tap with water flowing from the faucet may use a generalized collision object in which the shape velocity is zero and the material velocity is the velocity of water emission. As another example, simulations with water characters that change in shape may also use generalized collision objects. As yet another example, material motion may be added to a simulation that follows a guide shape by setting the guide shape as a generalized collision object with the desired material flow through it.

Advantageously, techniques disclosed herein use generalized collision objects to unify regular collisions, sources and sinks. As a result the artist no longer needs to think in terms of regular collisions, sources, and sinks to figure out what is appropriate in each particular setup, and the artist may instead work directly with the material flow and specify the shape and motion (shape velocity) of the affected region along with the flow of material in a neighborhood of the region. The system then automatically determines and enforces simulation boundary conditions using the generalized collision objects. Doing so saves time and eliminates the need for artists to paint sink/source boundary conditions by hand, which can be difficult to do correctly in many cases. Further, a number of control possibilities are made available to the artist, such as the example above of adding material motion to a simulation that follows a guide shape by setting the guide shape as a generalized collision object with the desired material flow through it. In addition, by using a material velocity during simulation that matches a physically correct material motion outside the simulation, continuity across the boundary of the generalized collision object may be achieved, leading to a seamless blend between the simulation and the material outside the simulation, which may be procedurally animated.

The flowchart and block diagrams in the Figures illustrate the architecture, functionality, and operation of possible implementations of systems, methods and computer program products according to various aspect of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order or out of order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the foregoing is directed to aspects of the present disclosure, other and further aspects of the disclosure may be devised without departing from the basic scope thereof, and the scope thereof is determined by the claims that follow.

What is claimed is:

1. A computer-implemented method for simulating a three-dimensional (3D) virtual environment, the computer-implemented method comprising:

receiving a 3D shape specifying a boundary of a generalized collision object, a shape velocity specifying at least one of a motion of the generalized collision object and a change in shape of the generalized collision object, and a material velocity specifying a motion of a material at the boundary of the generalized collision object, wherein the 3D shape encompasses a solid object configured to advance across the material, wherein the 3D shape divides the material into (i) an inner portion surrounding the solid object and that is inside of the 3D shape and (ii) an outer portion surrounding the inner portion and that is outside of the 3D shape;

determining surfaces defining the 3D shape that respectively act as a source, a sink, and an impenetrable collision object based on a normal component of the material velocity being respectively greater than, less than, and equal to a normal component of the shape velocity at the surfaces, the impenetrable collision object having at least one of a sliding collision and a sticky collision with the material;

performing a simulation of the motion of the generalized collision object, including motion of the inner portion surrounding the solid object, as the generalized collision object advances across the material, by performing, for one or more time steps of the simulation, advection and adding or consuming material based on the determined surfaces acting as the source, the sink, and the impenetrable collision object and by operation of one or more computer processors; and rendering, based on the simulation, one or more images comprising one or more frames of an animation.

2. The computer-implemented method of claim 1, wherein:

the motion of the material includes a Stokes wave; and the material velocity is obtained by differentiating a Stokes wave velocity potential at the boundary of the generalized collision object.

3. The computer-implemented method of claim 1, wherein:
the motion of the material includes a sum of Stokes waves or a deep ocean spectrum; and
the material velocity is obtained by:
scattering points in the volume of interest,
deforming the points using the deep ocean spectrum, and
determining the material velocity from position changes in time.

4. The computer-implemented method of claim 1, wherein at least one of the surfaces defining the 3D shape is obtained via a procedural animation or eroding of the same.

5. The computer-implemented method of claim 1, wherein the material velocity is obtained based on a prior simulation.

6. The computer-implemented method of claim 1, wherein the simulation is an Eulerian simulation, a Lagriangian simulation, or a hybrid Eulerian-Lagrangian simulation.

7. The computer-implemented method of claim 1, wherein performing the simulation includes, for the one or more time steps:
receiving a material state;
applying forces; and
resolving forces and the material state based on a physical model and the material velocity used as a velocity boundary condition.

8. The computer-implemented method of claim 1, wherein the animation is output, wherein the material velocity is obtained based on a prior simulation, wherein at least a portion of the 3D shape is obtained via a procedural animation or eroding of the same.

9. The computer-implemented method of claim 8, wherein the motion of the material includes a Stokes wave, wherein the material velocity is obtained by differentiating a Stokes wave velocity potential at the boundary of the generalized collision object, wherein the surfaces are determined without requiring input specifying any source, sink, and impenetrable collision object.

10. The computer-implemented method of claim 9, wherein the motion of the material includes, in respective instances, a sum of Stokes waves and a deep ocean spectrum, wherein the material velocity is obtained by:
scattering points in a volume of interest,
deforming the points using the deep ocean spectrum, and
determining the material velocity from position changes in time.

11. The computer-implemented method of claim 10, wherein the simulation is, in respective instances, an Eulerian simulation, a Lagriangian simulation, and a hybrid Eulerian-Lagrangian simulation, wherein the material is, in respective instances, water, snow, sand, dirt, and lava.

12. The computer-implemented method of claim 11, wherein performing the simulation includes, for the one or more time steps:
receiving a material state;
applying forces; and
resolving forces and the material state based on a physical model and the material velocity used as a velocity boundary condition.

13. A non-transitory computer-readable medium storing a program executable to perform operations for simulating a three-dimensional (3D) virtual environment, the operations comprising:
receiving a 3D shape specifying a boundary of a generalized collision object, a shape velocity specifying at least one of a motion of the generalized collision object and a change in shape of the generalized collision object, and a material velocity specifying a motion of a material at the boundary of the generalized collision object, wherein the 3D shape encompasses a solid object configured to advance across the material, wherein the 3D shape divides the material into (i) an inner portion surrounding the solid object and that is inside of the 3D shape and (ii) an outer portion surrounding the inner portion and that is outside of the 3D shape;
determining surfaces defining the 3D shape that respectively act as a source, a sink, and an impenetrable collision object based on a normal component of the material velocity being respectively greater than, less than, and equal to a normal component of the shape velocity at the surfaces, the impenetrable collision object having at least one of a sliding collision and a sticky collision with the material;
performing a simulation of the motion of the generalized collision object, including motion of the inner portion surrounding the solid object, as the generalized collision object advances across the material, by performing, for one or more time steps of the simulation, advection and adding or consuming material based on the determined surfaces acting as a source, a sink, and an impenetrable collision object and by operation of one or more computer processors when executing the program; and
rendering, based on the simulation, one or more images comprising one or more frames of an animation.

14. The non-transitory computer-readable medium of claim 13, wherein:
the motion of the material includes a Stokes wave; and
the material velocity is obtained by differentiating a Stokes wave velocity potential at the boundary of the generalized collision object.

15. The non-transitory computer-readable medium of claim 13, wherein:
the motion of the material includes a sum of Stokes waves or a deep ocean spectrum; and
the material velocity is obtained by:
scattering points in a volume of interest,
deforming the points using the deep ocean spectrum, and
determining the material velocity from position changes in time.

16. The non-transitory computer-readable medium of claim 13, wherein at least a portion of the 3D shape is obtained via a procedural animation or eroding of the same.

17. The non-transitory computer-readable medium of claim 13, wherein the material velocity is obtained based on a prior simulation.

18. The non-transitory computer-readable medium of claim 13, wherein the simulation is an Eulerian simulation, a Lagriangian simulation, or a hybrid Eulerian-Lagrangian simulation.

19. The non-transitory computer-readable medium of claim 13, wherein performing the simulation includes, for the one or more time steps:
receiving a material state;
applying forces; and
resolving forces and the material state based on a physical model and the material velocity used as a velocity boundary condition.

20. A system to perform operations for simulating a three-dimensional (3D) virtual environment, the system comprising:
  one or more computer processors; and
  a memory including a program executable by the one or more computer processors to perform operations comprising:
    receiving a 3D shape specifying a boundary of a generalized collision object, a shape velocity specifying at least one of a motion of the generalized collision object and a change in shape of the generalized collision object, and a material velocity specifying a motion of a material at the boundary of the generalized collision object, wherein the 3D shape encompasses a solid object configured to advance across the material, wherein the 3D shape divides the material into (i) an inner portion surrounding the solid object and that is inside of the 3D shape and (ii) an outer portion surrounding the inner portion and that is outside of the 3D shape;
    determining surfaces defining the 3D shape that respectively act as a source, a sink, and an impenetrable collision object based on a normal component of the material velocity being respectively greater than, less than, and equal to a normal component of the shape velocity at the surfaces, the impenetrable collision object having at least one of a sliding collision and a sticky collision with the material;
    performing a simulation of the motion of the generalized collision object, including motion of the inner portion surrounding the solid object, as the generalized collision object advances across the material, by performing, for one or more time steps of the simulation, advection and adding or consuming material based on the determined surfaces acting as the source, the sink, and the impenetrable collision object; and
    rendering, based on the simulation, one or more images comprising one or more frames of an animation.

* * * * *

UNITED STATES PATENT AND TRADEMARK OFFICE
CERTIFICATE OF CORRECTION

PATENT NO. : 11,062,060 B2
APPLICATION NO. : 15/261602
DATED : July 13, 2021
INVENTOR(S) : Alexey Stomakhin Page 1 of 1

It is certified that error appears in the above-identified patent and that said Letters Patent is hereby corrected as shown below:

In the Specification

In Column 11, Line 61, delete "Lagriangian," and insert -- Lagrangian, --, therefor.

In the Claims

In Column 15, Line 6, in Claim 3, delete "the" and insert -- a --, therefor.

In Column 15, Lines 18-19, in Claim 6, delete "Lagriangian" and insert -- Lagrangian --, therefor.

In Column 15, Line 51, in Claim 11, delete "Lagriangian" and insert -- Lagrangian --, therefor.

In Column 16, Line 58, in Claim 18, delete "Lagriangian" and insert -- Lagrangian --, therefor.

Signed and Sealed this
Seventh Day of December, 2021

Drew Hirshfeld
*Performing the Functions and Duties of the
Under Secretary of Commerce for Intellectual Property and
Director of the United States Patent and Trademark Office*